United States Patent [19]

Sinton et al.

[11] Patent Number: 4,960,468
[45] Date of Patent: Oct. 2, 1990

[54] PHOTOVOLTAIC CONVERTER HAVING APERTURED REFLECTIVE ENCLOSURE

[75] Inventors: Ronald A. Sinton, Palo Alto; Richard M. Swanson, Los Altos, both of Calif.

[73] Assignee: The Board of Trustees of the Leland Stanford Junior University, Palo Alto, Calif.

[21] Appl. No.: 260,250

[22] Filed: Oct. 20, 1988

[51] Int. Cl.$^5$ .................... H02N 6/00; H01L 31/04
[52] U.S. Cl. ................................................ 136/259
[58] Field of Search .......................... 136/253, 259

[56] References Cited

U.S. PATENT DOCUMENTS

| | | | |
|---|---|---|---|
| 1,935,698 | 11/1933 | Decker | 338/19 |
| 2,066,611 | 1/1937 | Christy | 136/259 |
| 2,330,620 | 9/1943 | Presser | 136/264 |
| 4,234,352 | 11/1980 | Swanson | 136/253 |
| 4,313,024 | 1/1982 | Horne | 136/253 |
| 4,388,481 | 6/1983 | Uroshevich | 136/246 |
| 4,419,532 | 12/1983 | Severns | 136/253 |
| 4,746,370 | 5/1988 | Woolf | 136/246 |

FOREIGN PATENT DOCUMENTS 62-101084  5/1987  Japan .................... 136/259

OTHER PUBLICATIONS

Patrick Campbell and Martin A. Green, "The Limiting Efficiency of Silicon Solar Cells under Concentrated Sunlight", *IEEE Trans. Electron Devices*, ED-33, No. 2, Feb., 1986, pp. 234–239.

Ronald A. Sinton and Richard M. Swanson, "Design Criteria for Si Point-Contact Concentrator Solar Cells", *IEEE Trans. Electron Devices*, vol. ED-34, No. 10, Oct., 1987, pp. 2116–2123.

Ronald A. Sinton and Richard M. Swanson, "Increased Photogeneration in Thin Silicon Concentrator Solar Cells", *IEEE Electron Device Letters*, vol. EDL-8, No. 11, Nov., 1987, pp. 547–549.

*Primary Examiner*—Aaron Weisstuch
*Attorney, Agent, or Firm*—Gregory O. Garmong

[57] ABSTRACT

A photovoltaic converter includes a photovoltaic cell and an enclosure around the cell with a reflective inner surface that reflects light to the cell. An aperture through the wall of the enclosure has a size smaller than the size of the photovaltaic cell. Light enters the enclosure through the aperture and falls upon the cell. Some light is reflected or not absorbed by the cell. This light is re-reflected back to the cell by the reflective inner surface of the enclosure. The small size of the aperture minimizes the escape of reflected light back out of the enclosure.

13 Claims, 2 Drawing Sheets

1 …

PHOTOVOLTAIC CONVERTER HAVING APERTURED REFLECTIVE ENCLOSURE

BACKGROUND OF THE INVENTION

This invention relates to photovoltaic conversion, and, more particularly, to solar cells having improved photovoltaic conversion efficiency.

Solar energy offers the potential for providing virtually unlimited energy for use by man, if the solar energy can be made available in a useful form. Much attention has been directed to the problem of using the sun's energy to obtain electricity, which can then be utilized through existing networks. One of the several approaches to generating electricity from solar radiation is the direct generation of electricity by photovoltaic converters.

At the heart of a photovoltaic converter is a photovoltaic cell, also sometimes termed a solar cell. The photovoltaic cell includes a semiconductor material having at least one P-N junction therein. Light falling upon the junction produces mobile electrical carriers in the form of electron-hole pairs, which can then be directed to an external electrical circuit. The operation of photovoltaic cells is described more fully in U.S. Pat. No. 4,234,352, whose disclosure is herein incorporated by reference.

The economics of using photovoltaic cells for many common applications is determined by the efficiency of the cell in converting sunlight to electrical energy. If the efficiency is low, large numbers of cells are required to provide the required electrical current, and the cost of the large number of cells may dictate the use of another energy source. By way of example, the presently most attractive material for construction of photovoltaic cells is silicon. The theoretical maximum conversion efficiency for silicon cells is about 36 percent using sunlight, and cells approaching 30 percent efficiency have been constructed. However, reaching this level of efficiency has required increasingly complex and costly designs for the photovoltaic cells themselves.

There exists a continuing need for modifications to photovoltaic converter design that increase the conversion efficiency of the system toward its maximum possible value. The present invention fulfills this need, and further provides related advantages.

SUMMARY OF THE INVENTION

The present invention provides a structure for a photovoltaic converter which results in an increase in conversion efficiency of about 3-4 percentage points. The structure permits the use of less complex and costly photovoltaic cells within the converter.

In accordance with the invention, a photovoltaic converter comprises a photovoltaic cell having an incident face upon which light is directed to cause photogeneration; an enclosure over the incident face, the wall of the enclosure having a reflective inner surface spaced apart from the incident face to permit light reflected from the incident face to be re-reflected by the inner surface and back to the photovoltaic cell; and an aperture through the wall of the enclosure to permit light to fall upon the photovoltaic cell, the size of the aperture being less than the size of the incident face.

Also in accordance with the invention, a photovoltaic converter comprises photovoltaic cell means for generating an electrical voltage when light falls upon an incident face thereof; re-reflection means for re-reflecting light that has been previously reflected from the photovoltaic means, back to the incident face of the photovoltaic means; and aperture means for permitting light to pass through the re-reflection means and fall upon the incident face of the photovoltaic means, the aperture means having an area smaller than that of the incident face.

The photovoltaic converter of the invention achieves improved conversion efficiency by more effectively utilizing all of the energy available in the incident light. One limit on efficiency of conventional cells is the reflection loss of light energy. The present converter structure substantially reduces that reflection loss by admitting light through an aperture of reduced size, which also is the only opening for light to leave the converter. Light reflected from the cell is re-reflected by the interior wall of the enclosure or the re-reflection means, back to the photovoltaic cell. It then enters (or reenters) the cell for utilization in the photovoltaic conversion process. Light energy is lost only when a reflected ray passes through the aperture. By making the size (area) of the aperture small relative to the size (area) of the photovoltaic cell, the loss of light energy is greatly reduced.

The present invention is preferably used in relation to a concentrator cell, wherein the light energy is concentrated to a beam of reduced size (and increased intensity) by a concentrator external to the photovoltaic converter. A converging mirror or lens is conventionally used to form a converging beam. This beam is directed through the aperture, increasing the intensity of light passing through the aperture well above that possible without the concentration effect. The concentrated beam is thereafter largely trapped within the enclosure, and its energy is converted to electrical energy with a high efficiency.

In accordance with this embodiment of the invention, a photovoltaic converter comprises a photovoltaic cell; an enclosure around the cell, the enclosure wall having a reflective inner surface; an aperture through the enclosure to permit light to pass through the wall of the enclosure and fall upon the cell, the size of the aperture being less than the size of the cell; and a photoconcentrator outside of the enclosure, the photoconcentrator acting to concentrate light and direct the concentrated light through the aperture and onto the photovoltaic cell.

The photovoltaic converter of the invention provides an important advancement in the art of solar cells. It directly increases conversion efficiency, and also reduces the constraints on photovoltaic cell design that have been introduced in order to reduce reflection and shading loss resulting from the structure of the cell itself. Other features and advantages of the invention will be apparent from the following more detailed description of the preferred embodiment, taken in conjunction with the accompanying drawings, which illustrate, by way of example, the principles of the invention.

DETAILED DESCRIPTION OF THE PREFERRED EMBODIMENTS

Figure 1:
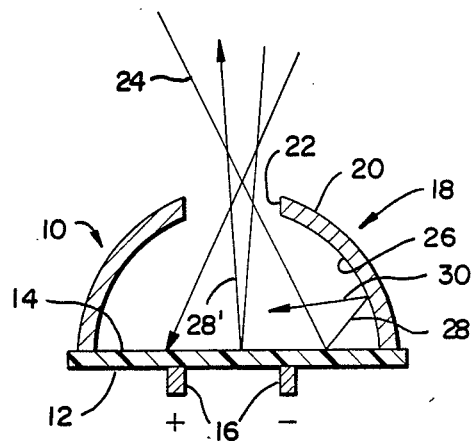
FIG. 1 is a side sectional view of an embodiment of a photovoltaic converter of the invention.

Before describing the preferred forms of the invention, it is useful to summarize some of the factors that lead to reduced conversion efficiency of photovoltaic converters. One of the primary causes of reduced conversion efficiency of conventional photovoltaic converters is the reflection of incident light. Whenever light impinges upon a surface, some fraction of the light is reflected from the surface and does not pass through to the interior of the material. In a photoconversion system, reflected light is normally lost to the system, and not available for conversion to electrical energy because its energy cannot be absorbed by the semiconductor material in the cell that converts light energy to electrical energy. Light reflected from the system is therefore a direct contributor to reduced efficiency.

There are three principal sources of reflected-light loss for conventional photovoltaic cells. First, a broad spectrum of light is reflected from the front face of the cell. Various cell improvements have been made to reduce this reflection by providing antireflective coatings or a textured surface to the front face of the cell. Second, a broad spectrum of light is reflected from internal structure within the cell, in particular the current-collecting grid that must be provided within the cell to direct the generated carriers to the external circuit. This reflected light cannot contribute to the formation of carriers. Approaches to solving this problem include reduced width of grid lines and introduction of sophisticated rear-grid designs, both of which have a reduced grid shadowing loss.

A third type of loss is not directly due to reflection of a broad spectrum of light from the structure of the cell. Semiconductor materials used in solar cells do not absorb light uniformly across the entire spectrum of wavelengths. In the case of the currently most important solar cell material, silicon, light at the low-wavelength end of the visible spectrum, the red light, is only weakly absorbed by the semiconductor material. Light in the red portion of the spectrum, which carries part of the energy of the incident light, therefore passes through the cell, reflects from the back surface of the cell, again passes through the cell in the other direction, and leaves the cell through the front face. The absorption coefficient is such that a significant portion of the energy in the red light is not converted to electricity by the cell, even during the course of many passes through the thickness of the cell, and is consequently lost.

This type of low absorption/reflectance loss suggests the desirability of using thick photovoltaic cells to maximize absorption of light, since the amount of energy absorbed increases with increasing path length inside the semiconductor. However, other design considerations such as the Auger recombination of carriers mandate a thinner cell. The trade-off between attaining complete absorption of light and reducing losses after conversion to electrical energy establish an optimum cell thickness that is very small, on the order of 10–50 micrometers. When such an optimal cell thickness is employed, much of the energy of the red light is lost to the photovoltaic cell.

The present invention reduces the loss of light energy due to all three of the reflectance-loss mechanisms. It achieves this reduction even without reliance on a textured front surface on the cell, and without the use of a rear-grid design, thereby reducing the complexity and cost of the photovoltaic cell itself. It also permits the use of relatively wide front grids, an important advantage for concentrator cells that generate a high power output.

A preferred form of the photovoltaic converter is illustrated in FIG. 1. A photovoltaic converter 10 includes a photovoltaic cell 12 with an incident surface 14 of area $A_c$ and having electrical leads 16 extending therefrom. A hemispherical enclosure 18 extends over the cell 12 in the manner of a dome. A wall 20 of the enclosure 18 has an aperture 22 of area $A_a$ therethrough, for admitting a light beam 24 to the interior of the enclosure 18. The relative aperture area is defined as $A_a/A_c$, and is always less than unity in the invention. An inner surface 26 of the wall 20 of the enclosure 18 is treated to reflect light. Preferably, the inner surface 26 is treated to have a high diffusive reflectivity, as by painting the inner surface white, or to have a high specular reflectivity, as by making the inner surface a highly polished mirror.

Once inside the enclosure, light in the beam 24 falls onto the cell 12. Some portion of the light is reflected from the cell (or its back surface) without being absorbed within the cell, for the reasons indicated earlier. In particular, a relatively larger amount of the energy of the red portion of the spectrum is reflected without being absorbed, as compared with other portions of the spectrum.

The light reflected from the cell 12, represented by the ray 28, can either fall upon the inner surface 26 and be reflected back to again be incident upon the cell 12, ray 30, or pass through the aperture 22 and leave the converter 10 without contributing to the production of electricity (ray 28'). By making the relative aperture area small, as about 0.2 or smaller, the amount of energy lost in rays 28' is small. Alternatively stated, the probability that a reflected ray will pass through the aperture and leave the converter, before it has passed through the cell many times in continuing reflections, is small. It is much more probable that a reflected ray will be internally reflected many times, passing through the cell many times, before it escapes through the aperture. More of its energy is utilized by the cell with each passage therethrough, increasing the conversion efficiency.

Figure 2:
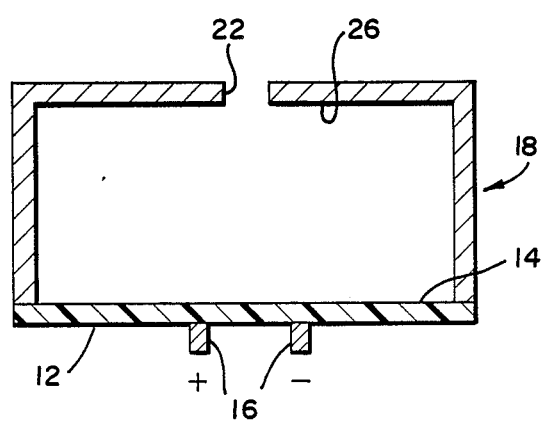
FIG. 2 is a side sectional view of another embodiment of photovoltaic converter.

Another embodiment of the converter 10 is shown in FIG. 2, wherein the enclosure 18 is of a rectangular box configuration rather than a hemisphere, and the other components generally remain the same as illustrated in FIG. 1.

Figure 3:
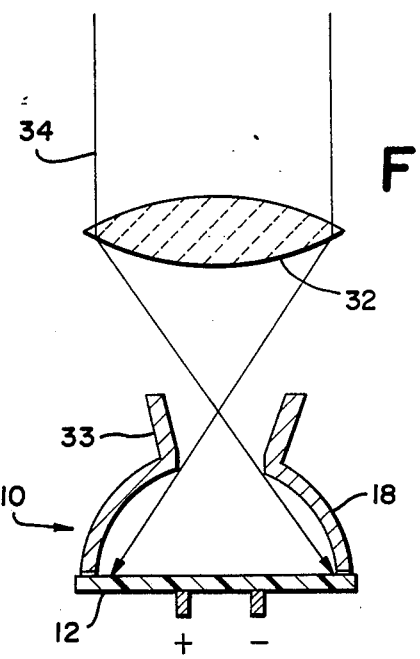
FIG. 3 is a side sectional view of a lens concentrator embodiment of the photovoltaic converter.
Figure 4:
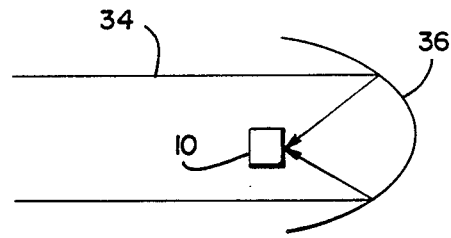
FIG. 4 is a side elevational view of a reflector concentrator embodiment of the photovoltaic converter.

FIGS. 3 and 4 illustrate concentrator embodiments of the converter, wherein external concentrators are added to the basic converter 10 illustrated in FIG. 1. In FIG. 3, a converging lens 32 is positioned in the light path approaching the converter 10. Light passing through the lens 32 is focused through the aperture 22 and into the interior of the converter 10. Stray rays of light are directed into the aperture, 22 by a funnel-like secondary optical element 33, which has an interior reflective surface that guides the light into the aperture.

Such secondary optical elements are readily used in conjunction with any type of concentrator converter. FIG. 3 provides an illustration of the basis for the increased conversion efficiency of the converter 10 of the invention, as compared with prior photoelectric cell configurations. If the initial beam 34 has an area of exactly $A_c$, the area of the cell 12, the total energy directed into the converter 10 is exactly the same as would impinge upon the cell in the absence of the enclosure 18. The output of the cell is, however, greater for the cell having an enclosure than one not having an enclosure, because the reflected portion of the beam is, to a large extent, trapped within the enclosure to produce greater efficiency.

FIG. 4 illustrates another concentrator converter, where the concentration of the beam is accomplished by a reflector 36. The beam from the reflector 36 enters the converter 10 through the aperture 22. Experience has shown that, for the best silicon concentrator cells currently available, optimal conversion is achieved for either type of concentrator converter when the intensity of the light at the cell is from about 50 to about 400 times the intensity of ordinary sunlight. The conversion efficiency of the cell increases with increasing intensity up to this range, and falls above this range.

In all of the embodiments, the converter of the invention provides increased efficiency of conversion of light to electrical energy through multiple reflection and thence increased utilization of the energy in the incident light. Calculations show that, based upon the typical levels of reflection, the use of the enclosure can increase the efficiency of a photoelectric converter by 3–4 percentage points. That is, if a particular cell configuration produces electrical energy with an efficiency of 22 percent without an enclosure, its efficiency with an enclosure is increased to about 25–26 percent. The efficiencies of the most efficient cells presently available, about 28 percent, could be increased to about 31–32 percent through the use of an enclosure to trap light.

The converter also reduces and/or removes constraints on the design of the photovoltaic cell, reducing its cost and potentially increasing its performance. In an effort to reduce reflection losses from the front surface and internal grid structures, special surface treatments and altered grid arrangements have been introduced. The photovoltaic converter of the invention reduces the need for these modifications, in that front reflection losses and internal structure reflection losses are permitted to occur, but the light energy is recaptured by another approach, the re-reflection of the reflected light (which is otherwise lost) back to the photovoltaic cell. Thus, it becomes less critical to minimize grid line widths, because light reflected by the grid lines ultimately finds its way back into the cell after reflection. Relaxation of this constraint on grid line width is particularly important for concentrator cells, where the numbers of charge carriers generated mandates a sufficient size of conductor paths so that internal resistance is not limiting of the device current.

The improved performance of photovoltaic converters utilizing the approach of the invention has been verified by both theory and experiment.

As to the light reflected from the front of the photovoltaic cell, most of this light is not lost when the cell is placed into an enclosure. The transmission of light into the photovoltaic cell, placed in an enclosure, is represented as $$T=(1-R)[1-R(1-F)]^{-1},$$

where R is the front surface reflectance and F is the previously defined relative aperture area $A_a/A_c$. For a value of F of 0.1 and a typical reflectance R of 0.1, the reflectance loss is reduced from 10 percent to 1.1 percent, significantly increasing the cell efficiency.

Figure 5:
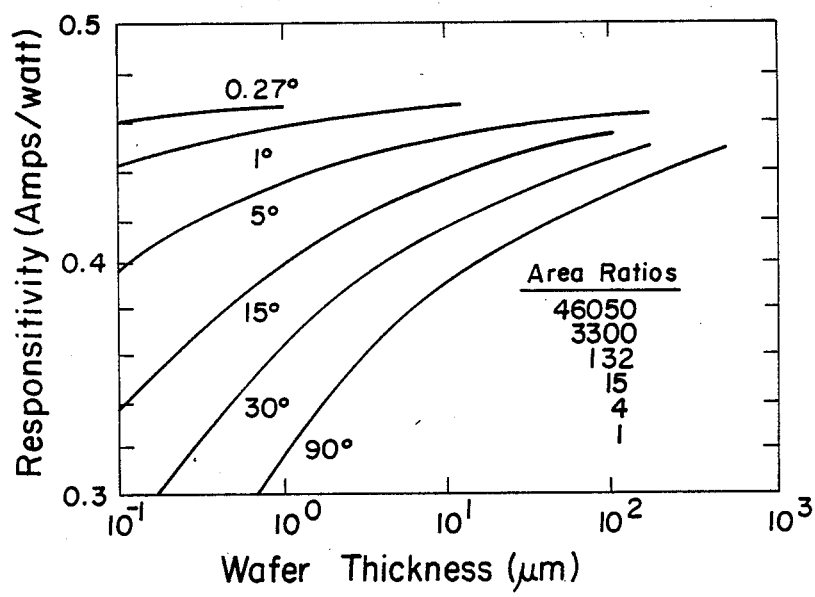
FIG. 5 is a calculated graph of cell electrical output as a function of aperture size and cell thickness.

As to light weakly absorbed by the material of the cell, red light in the case of the silicon solar cell, this light is reflected back and forth through the photovoltaic cell many times when the cell is within a reflective enclosure. The light leaves the enclosure, terminating its reflections, only when it passes out the aperture. FIG. 5 illustrates the calculated current of a front texturized cell per incident watt of light as a function of the reciprocal of the relative aperture area F. The output of the cell increases significantly as the aperture is reduced in size. This model assumes that the incoming beam of light is concentrated sufficiently to pass through the aperture, even when small.

Figure 6:
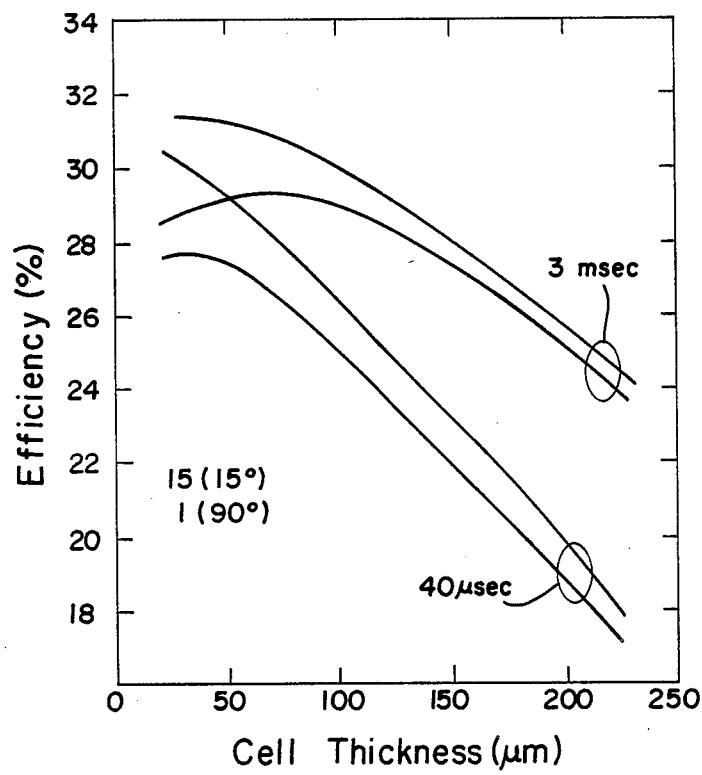
FIG. 6 is a calculated graph of photovoltaic converter efficiency as a function of the use of an enclosure, the quality of the silicon used in the photovoltaic cell, and the cell thickness.

A further calculation of the efficiency of solar cells with and without an enclosure is presented in FIG. 6. To calculate the curves, a model was developed to predict the performance of cells, such as a demonstrated 25 percent efficient point-contact solar photovoltaic cell. The two upper curves indicate the predicted performance of a cell with (upper curve of pair) and without (lower curve of pair) an enclosure, wherein the silicon is relative good quality with a minority carrier lifetime of about 3 milliseconds. For this calculation, the cell area was assumed to be 15 times larger than the aperture area. The two lower curves present a similar calculation for a poor quality silicon material having a minority carrier lifetime of about 40 microseconds. The enclosure improves the performance in each case. Significantly, the efficiency of silicon solar cells made of inexpensive, relatively poor quality material, may be made quite high by making the cells thin and placing them into an enclosure.

The enhancement shown in FIGS. 5 and 6 assumes no front surface reflection from the cell. Therefore, the relative improvement from increased red response shown in these two figures is in addition to the enhancement discussed above for minimizing the front surface reflection.

Experiments have been conducted to verify the improved performance of the photovoltaic converters that utilize the principles of reflection set forth herein. Three boxlike enclosures of the type illustrated generally in FIG. 2 were constructed with different sizes and configurations. In each case, the interior walls and one side of the lid were made reflective with a silver polymer film. The other side of the lid was painted black, so that the effect of the elimination of reflection could be studied. The results are presented as the percentage improvement in short circuit current of the cell using the reflective lid, and compared with the same quantity obtained using the black lid. The entire enclosure was angled slightly relative to the incoming light beam to avoid specular reflection back out of the aperture. The illumination was one sun intensity from a heliostat, passing into the photovoltaic converter.

The first converter enclosure was a rectangular box having a base 6 centimeters on a side and a height of 4.5 centimeters. The aperture diameter was 1 centimeter. The active area of the silicon cell was about 6 centimeters on a side, was 280 micrometers thick, and was not texturized on the front surface. The short circuit current was increased by 23 percent using the reflective lid as compared with the black lid.

The second converter enclosure was a rectangular box having a base 3.2 centimeters on a side and a height of 1.8 centimeters. The aperture diameter was 1 centimeter. The active area of the silicon cell was about 3.2 centimeters on a side, was 108 micrometers thick, and was texturized on the front surface. The short circuit current was increased by 4 percent using the reflective lid as compared with the black lid.

The third converter enclosure was a right circular cylinder having a diameter of 1.5 centimeters and a height of 1.7 centimeters. The aperture diameter was 4 millimeters. The silicon cell was about 1.5 centimeters in diameter, was 280 micrometers thick, and was not texturized. A 20 percent enhancement of the short circuit current was observed for the reflective lid as compared with the black lid.

The above experiments using the first and second converters were repeated with a red-pass filter (a piece of silicon 380 micrometers thick) covering the aperture on the outside, so that only red light is passed through to the interior of the converter. Using a texturized cell, there was an increase in the current by 21 percent for the reflective lid as compared with the black lid. Using an untexturized cell, there was an increase in the current of 210 percent for the reflective lid as compared with the black lid. The use of the enclosure more than doubles the absorption and utilization of the red component of the light by this solar cell.

Although particular embodiments of the invention have been described in detail for purposes of illustration, various modifications may be made without departing from the spirit and scope of the invention. Accordingly, the invention is not to be limited except as by the appended claims.

What is claimed is:

1. A photovoltaic converter, comprising:
   a photovoltaic cell having an incident face upon which light is directed to cause photogeneration;
   an enclosure over the incident face, the wall of the enclosure having a reflective inner surface spaced apart from the incident face to permit light reflected from the incident face to be re-reflected by the inner surface and back to the photovoltaic cell; and
   an aperture through the wall of the enclosure to permit light to fall directly upon the voltaic cell, the ratio of the area of the aperture to the area of the incident face of the photovoltaic cell being less than about 0.2.

2. The photovoltaic converter of claim 1, wherein the photovoltaic cell is a solar cell.

3. The photovoltaic converter of claim 1, wherein the photovoltaic cell is a silicon cell.

4. The photovoltaic converter of claim 1, wherein the enclosure is hemispherical in shape.

5. The photovoltaic converter of claim 1, wherein the inner surface of the enclosure is white in color.

6. The photovoltaic converter of claim 1, wherein the inner surface of the enclosure is a polished mirror.

7. The photovoltaic converter of claim 1, further including:
   a photoconcentrator outside of the enclosure, the photoconcentrator acting to concentrate light and direct the concentrated light through the aperture and onto the incident face of the photovoltaic cell.

8. The photovoltaic converter of claim 1, further including:
   photoconcentrator means for concentrating light and directing the concentrated light through the aperture means and onto the incident face of the photovoltaic cell means.

9. A photovoltaic converter, comprising:
   photovoltaic cell means for generating an electrical voltage when light falls upon an incident face thereof;
   re-reflection means for re-reflecting light that has been previously reflected from the photovoltaic means, back to the incident face of the photovoltaic means; and
   aperture means for permitting light to pass through the re-reflection means and fall directly upon the incident face of the photovoltaic means, the ratio of the area of the aperture to the area of the incident face of the photovoltaic cell being less than about 0.2.

10. The photovoltaic converter of claim 9, wherein the re-reflection means includes an enclosure having a reflective inner surface.

11. A photovoltaic converter, comprising:
    a photovoltaic cell having an incident face of area $A_c$:
    an enclosure around the cell, the enclosure wall having a reflective inner surface;
    an aperture of area $A_a$ through the enclosure to permit light to pass through the wall of the enclosure and fall directly upon the incident face of the cell, the ratio $A_a/A_c$ being less than about 0.2.

12. The photovoltaic converter of claim 11, wherein the photoconcentrator is a mirror.

13. The photovoltaic converter of claim 11, wherein the photoconcentrator is a lens.

* * * * *